US009260849B2

(12) United States Patent
Frey et al.

(10) Patent No.: US 9,260,849 B2
(45) Date of Patent: Feb. 16, 2016

(54) DISPENSING DEVICE HAVING A PIEZOELECTRIC ELEMENT

(71) Applicant: Henkel AG & Co. KGaA, Duesseldorf (DE)

(72) Inventors: Daniel Frey, Duesseldorf (DE); Cedric Zaugg, Neuchatel (CH); Amir Feriani, Auvernier (CH); Jean-Paul Sandoz, Cormondreche (CH)

(73) Assignee: Henkel AG & Co. KGaA, Duesseldorf (DE)

( * ) Notice: Subject to any disclaimer, the term of this patent is extended or adjusted under 35 U.S.C. 154(b) by 433 days.

(21) Appl. No.: 13/647,110

(22) Filed: Oct. 8, 2012

(65) Prior Publication Data
US 2013/0025038 A1  Jan. 31, 2013

Related U.S. Application Data

(63) Continuation of application No. PCT/EP2010/067347, filed on Nov. 12, 2010.

(30) Foreign Application Priority Data

Apr. 9, 2010  (DE) .................... 10 2010 003 810

(51) Int. Cl.
*E03D 9/02* (2006.01)
*E03D 9/03* (2006.01)
(Continued)

(52) U.S. Cl.
CPC ............ *E03D 9/032* (2013.01); *B05B 17/0607* (2013.01); *H01L 41/1132* (2013.01)

(58) Field of Classification Search
CPC .... E03D 9/032; H01L 1/1132; B05B 17/0607
USPC ............ 4/222, 223, 224, 227.1, 227.5–227.7; 222/39, 52, 61, 648, 649, 646, 192; 239/67, 71, 102.1
See application file for complete search history.

(56) References Cited

U.S. PATENT DOCUMENTS 5,265,288 A  * 11/1993  Allison ............................. 4/620
6,694,536 B1 *  2/2004  Haygreen ...................... 4/246.1
(Continued)

FOREIGN PATENT DOCUMENTS

DE  102007040323 A1 *  2/2009  ................ E03D 9/00
DE  102007040327 A1 *  2/2009  ................ E03D 9/00
EP  1475108 A2  11/2004

OTHER PUBLICATIONS

Written Opinion of the International Search Authority for PCT/EP2010/067347.*

(Continued)

*Primary Examiner* — Lauren Crane
*Assistant Examiner* — Erin Deery
(74) *Attorney, Agent, or Firm* — P. Scott Smith

(57) ABSTRACT

A release device for releasing a flowable preparation includes an electrical energy source, a control unit connected to the energy source, a sensor unit, a release element and an acoustic transducer. The sensor unit is a piezoelectric element suitable for picking up sound waves and/or structure-borne noise from the surrounding environment and converting them into a sensor signal which is converted in the control unit into a control signal for the release element. The release element is the same piezoelectric element and is supplied with electrical signals from the control unit and sprays at least one first preparation from at least one first container. The acoustic transducer is the same piezoelectric element and is supplied with electrical signals from the control unit, which electrical signals are converted by the piezoelectric element into audible acoustic signals in a frequency range of 20 Hz to 20 kHz.

8 Claims, 1 Drawing Sheet

(51) Int. Cl.
   *B05B 17/06*   (2006.01)
   *H01L 41/113*   (2006.01)

(56) References Cited

U.S. PATENT DOCUMENTS

| | | | | |
|---|---|---|---|---|
| 7,219,848 B2* | 5/2007 | Sweeton | ................ | 239/102.2 |
| 7,861,943 B2 | 1/2011 | Feriani et al. | | |
| 8,816,860 B2* | 8/2014 | Ophardt et al. | ............ | 340/573.1 |
| 2009/0249533 A1* | 10/2009 | Sawalski et al. | ................ | 4/223 |
| 2010/0205728 A1* | 8/2010 | Muhlhausen et al. | ............ | 4/223 |
| 2010/0205731 A1* | 8/2010 | Muhlhausen et al. | ............ | 4/223 |
| 2010/0206306 A1* | 8/2010 | Feriani et al. | ................ | 222/52 |

OTHER PUBLICATIONS

PCT International Search Report (PCT/EP2010/067347) dated Feb. 2, 2011.

* cited by examiner

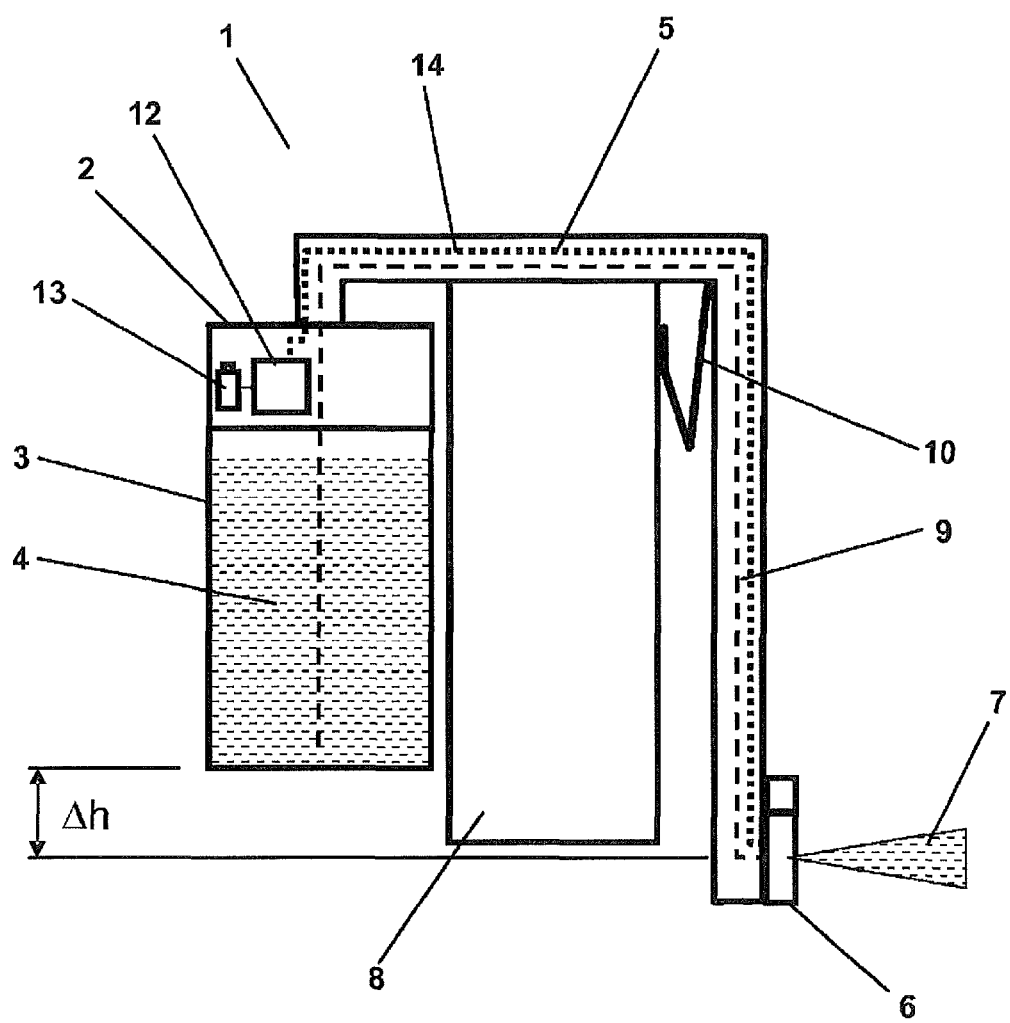

DISPENSING DEVICE HAVING A PIEZOELECTRIC ELEMENT

FIELD OF THE INVENTION

The present invention generally relates to an electrically driven release device, and more particularly relates to a toilet freshener, comprising acoustic signal detection, in particular flush water detection, release of preparation, in particular in or on a toilet bowl, and an acoustic signal generator, wherein signal detection, release of preparation and the acoustic signal generator is embodied by a piezo element.

BACKGROUND OF THE INVENTION

Accurate dispensing which is appropriate to requirements of flowable or pourable compositions is of relevance in a large number of fields of application.

Domestically, in particular, the dispensing of flowable substances is gaining in significance, this having its basis primarily in the exact dispensing, controlled according to requirements, of the corresponding active substances, whereby on the one hand the environment is protected by resource conservation and the prevention of incorrect or over-dispensing, while on the other hand the efficiency of the active substances dispensed in this way is optimized.

The dispensing of cleaning and scenting compositions in the toilet area is currently effected primarily by "toilet fresheners". These comprise single- or multi-chamber containers, which are hung in the toilet bowl in such a way that, during the process of flushing the toilet bowl with water, an active substance is released from the toilet freshener into the toilet bowl.

Such devices are known for example from EP0828902 or DE10113036.

A significant disadvantage of these toilet fresheners is that dispensing depends substantially on the respective local flow conditions in the toilet bowl during the flushing process. However, flow conditions may differ widely as a function of toilet type and the positioning of the toilet freshener in or on the toilet bowl. It may thus happen, for example, that with certain toilet types no active substance is released from the toilet freshener, since no or insufficient water flows over the toilet freshener during the flushing process and the dispensing mechanism of the toilet freshener is thus not initiated.

Also, if flush water flows as intended over a toilet freshener, this is disadvantageous insofar as the water path intended by the toilet manufacturer is disturbed, whereby the flushing performance of a toilet may be noticeably reduced.

Active substances are usually released from such toilet fresheners as a result of penetration of flush water through openings in the toilet freshener, the preparations being partially dissolved and discharged by and swept away from the toilet freshener when the flush water exits through corresponding outlet openings. Depending on how the toilet freshener is arranged in the toilet, the strength of flow through it varies due to the frequently locally very different flow conditions involved in flush water outlet from the toilet bowl rim, whereby only diffuse release of the active substances may be achieved.

Conventionally the flush water stream is influenced, as described above, by the introduction of a toilet freshener. The changed flow conditions may change the flushing behavior of the toilet markedly. Frequently the flush water stream is influenced in such a way that water is splashed upwards out of the toilet bowl, such that flush water escapes from the toilet bowl or may come into contact with the user when the toilet is used, which as a rule is regarded as unpleasant.

Moreover, a purposeful flow path in toilets is designed as an attempt to reduce further the quantities of flush water used while maintaining the same or improved flushing behavior, such that any intervention in the flush water flow in toilets optimized in this way has a far greater effect on flushing behavior.

It would thus be desirable to have a release device for releasing active substances into a toilet bowl which dispenses active substances into the toilet bowl independently of the toilet flushing process.

In addition to targeted dispensing of preparations in a toilet, accurate dispensing of preparations in a manner appropriate to the circumstances has in particular also reached the field of automatic washing and dishwashing agents. These automatic washing and dishwashing agents are typically offered for sale to the consumer in solid form, for example as a powder or as tablets, but increasingly also in liquid or gel form. For some considerable time, attention has focused on convenient dispensing of washing and cleaning agents and on simplifying the operations required to carry out a washing or cleaning method.

Furthermore, one of the main objectives of manufacturers of automatic washing and cleaning agents is to improve the washing and cleaning performance of these agents, increasing attention having been paid in recent times to washing and cleaning performance in low temperature washing and cleaning cycles or in washing and cleaning cycles with reduced water consumption. To this end, new ingredients, for example more highly active surfactants, polymers, enzymes or bleaching agents have been added to the washing and cleaning agents. However, since new ingredients are only available to a limited extent and the quantity of the ingredients used per washing and cleaning cycle cannot be increased at will for environmental and economic reasons, there are natural limits to this approach to solving the problem.

In this connection, devices for multiple dispensing of washing and cleaning agents have recently in particular come to the attention of product developers. In terms of these devices, a distinction may be drawn between dispensing chambers integrated into the dishwashing machine or washing machine, on the one hand, and separate devices independent of the dishwashing machine or washing machine, on the other hand. These devices, which contain a multiple of the quantity of washing or cleaning agent required to carry out a washing or cleaning method, automatically or semi-automatically dispense washing or cleaning agent portions into the interior of the water-conveying domestic appliance over the course of a plurality of successive washing or cleaning methods. For the consumer, manual dispensing for each cleaning or washing cycle is no longer necessary. Examples of such devices are described in European patent application EP 1 759 624 A2 (Reckitt Benckiser) or in German patent application DE 53 5005 062 479 A1 (BSH Bosch and Siemens Hausgeräte GmbH).

For detecting a rinsing or washing section within a treatment program of a water-conveying domestic appliance, it is desirable to have the simplest and most reliable sensor system possible, and the simplest possible release element for dispensing the corresponding preparations.

It is furthermore desirable for a user to receive signals from such a release device, for example to indicate that a preparation is being sprayed or the end of a spraying operation.

The object of the invention is accordingly to provide a compact, inexpensive to manufacture device which dispenses preparations in response to predetermined, sensor-detected measured variables and which indicates at least the start and/or the end of active substance release to the user.

Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A release device for releasing a flowable preparation, in particular a toilet freshener for fastening to the rim of a toilet, includes an electrical energy source, a control unit which is connected to the energy source, a sensor unit, a release element and an acoustic transducer, in which the sensor unit is a piezoelectric element which is suitable for picking up oscillations, in particular sound waves in a frequency range of 1 kHz-300 kHz and/or structure-borne noise from the surrounding environment of the release device and converting them into a sensor signal, which is converted in the control unit into a control signal, in particular for the release element, the release element is a piezoelectric element which is supplied with electrical signals from the control unit and sprays at least one first preparation from at least one first container which is connected in communicating manner with the release element, the acoustic transducer is a piezoelectric element which is supplied with electrical signals from the control unit, which electrical signals are converted by the piezoelectric element into audible acoustic signals in a frequency range of 20 Hz to 20 kHz, preferably of 5-15 kHz, particularly preferably of 7-10 kHz, the sensor unit, the release element and the acoustic transducer are constructed as a single component.

BRIEF DESCRIPTION OF THE DRAWINGS

The present invention will hereinafter be described in conjunction with the following drawing figures, wherein like numerals denote like elements, and FIG. 1 is a schematic diagram that depicts a toilet freshener that includes a piezoelectric element.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Although the release device according to the invention is explained in greater detail below with reference to the example of application of a toilet freshener, the invention is not, however, limited hereto. It is instead conceivable to use the release device according to the invention in dishwashing machines, washing machines, washer/dryers and such use will be explained in greater detail at a subsequent point.

The release device according to the invention for releasing a flowable preparation, in particular a toilet freshener for fastening to the rim of a toilet, comprises an electrical energy source, a control unit which is connected to the energy source, a sensor unit, a release element and an acoustic transducer, wherein the sensor unit is a piezoelectric element, which is suitable for picking up oscillations, in particular sound waves and/or for example electromagnetic waves in a frequency range of 1 kHz-300 kHz, preferably of 20-25 kHz and/or structure-borne noise from the surrounding environment of the release device and converting them into a sensor signal, which is converted in the control unit into a control signal, in particular for the release element; the release element is a piezoelectric element which is supplied with electrical signals from the control unit and sprays at least one first preparation from at least one first container which is connected in communicating manner with the release element; the acoustic transducer is a piezoelectric element which is supplied with electrical signals from the control unit, which electrical signals are converted by the piezoelectric element into audible acoustic signals in a frequency range of 20 Hz to 20 kHz, preferably of 5-15 kHz, particularly preferably of 7-10 kHz, wherein the sensor unit, the release element and the acoustic transducer are constructed as a single component.

In an alternative preferred variant, the release device according to the invention differs from that described merely in that the sensor unit is a piezoelectric element which is suitable for picking up oscillations, in particular sound waves and/or for example electromagnetic waves in a frequency range of 1 kHz-300 kHz, preferably of 20-41 kHz, particularly preferably of 27-41 kHz from the surrounding environment of release device and converting them into a sensor signal.

The piezoelectric element of the described release devices thus performs three functions in the release devices. It firstly acts as a sensor for detecting oscillations, noise and structure-borne noise, while also acting as a release element for spraying preparation and as an acoustic signal generator. As a consequence, the release device may be of compact embodiment and be manufactured inexpensively.

It is particularly preferable for the piezoelectric sensor to be configured to detect sound waves in a range of 20-25 kHz and for the control unit to evaluate this frequency range in particular, since comparatively little background noise due to sound or electromagnetic waves, e.g. from lamps, occurs in this frequency band.

In the above-described alternative variant, the piezoelectric sensor may alternatively be configured to detect oscillations, in particular sound waves and/or for example electromagnetic waves, in a range of 20-41 kHz, particularly preferably of 27-41 kHz. In this case, a detectable frequency would for example be located above the audible frequency range and below the frequency range of for example fluorescent tubes.

In the described release devices, the audible acoustic signal may be for example a simple, monophonic beep at a constant frequency, or alternatively monophonic sequences of notes of different frequencies as well as more complex signals such as for example polyphonic sequences of notes or language and the reproduction of digitized music or noises.

It is preferred for the electrical signals which bring about spraying of a preparation to have a frequency of 70-400 kHz, preferably of 80-90 kHz, and for the electrical signals which bring about the generation of an audible acoustic signal to have a frequency of 20 Hz-20 kHz, preferably of 5-15 kHz and particularly preferably of 7-10 kHz.

It is conceivable for the control unit to supply the piezoelectric element simultaneously and/or with a time delay with the electrical signals which bring about spraying of a preparation and with the electrical signals which bring about the generation of an audible acoustic signal. Where supply proceeds simultaneously, it is for example possible to provide the user with an acoustic indication that the release element is active and preparation is being sprayed. Where supply proceeds with a time delay, a corresponding acoustic signal may for example indicate the start and/or finish of a release process. Any desired combinations are, of course, conceivable in this connection. For example, it would also be possible to indicate the start of a release process with a first acoustic signal, the active substance release with a second acoustic signal and the finish of the release process with a third acoustic signal, the acoustic signals advantageously differing from one another.

It is advantageous for use of the release device as a toilet freshener for the sensor unit to be configured such that it detects structure-borne noise in a toilet bowl which is produced by triggering of the flush water stream and a sensor signal which represents triggering of the flush water stream is generated. It is furthermore preferable for the sensor unit to be configured such that it detects noise within the toilet bowl which is brought about by triggering of the flush water stream and a sensor signal which represents triggering of the flush water stream is generated.

In order to ensure the best possible identification of a flush water stream, it is advantageous for the sensor unit and the release element to be directed into the interior of the toilet bowl.

The invention furthermore provides a method for operating the release device according to the invention, wherein the method comprises the following steps that:

- a sensor unit which is a piezoelectric element picks up oscillations, in particular sound waves in a frequency range of 1 kHz-300 kHz, preferably of 20-25 kHz and/or structure-borne noise from the surrounding environment of the release device and converts them into a sensor signal,
- a release element which is a piezoelectric element is supplied with electrical signals from the control unit in the presence of a defined sensor signal, such that at least one first preparation (10) is sprayed and/or atomized from at least one first container (9) which is connected in communicating manner with the release element,
- an acoustic transducer which is a piezoelectric element is supplied with electrical signals from the control unit (4) before and/or during and/or after spraying of the preparation, which electrical signals are converted by the piezoelectric element into audible acoustic signals in a frequency range of 20 Hz to 20 kHz, preferably of 5-15 kHz, particularly preferably of 7-10 kHz.

An alternative preferred method differs from the described method merely in that a sensor unit which is a piezoelectric element picks up oscillations, in particular sound waves and/or for example electromagnetic waves in a frequency range of 1 kHz-300 kHz, preferably 20-41 kHz, particularly preferably 27-41 kHz from the surrounding environment of the release device and converts them into a sensor signal. In both described methods, the release device according to the invention consists of various components which may in turn be combined into assemblies. The components of the release device may comprise a release element, a control unit, a sensor unit, an acoustic transducer, an energy source, a container, a fastening means and a preparation. In a preferred embodiment of the invention, the components control unit, sensor unit, release element, acoustic transducer and energy source may be combined into a "dispenser" assembly. The components and assemblies are described below.

Dispenser

The energy source necessary to operate the release device, a control unit, a sensor unit, a release element and an acoustic transducer are integrated into the dispenser. Preferably, the dispenser consists of a housing protected from water splashing, which prevents the penetration of water splashes, as may for example occur when the release device according to the invention is used as a toilet freshener in a toilet bowl, into the interior of the dispenser.

It is additionally preferred for the dispenser to be arranged on the outer rim of the toilet bowl, so enabling on the one hand protection from exposure to water splashes and on the other hand convenient operation of the dispenser. In addition, the dispenser does not project into the interior of the toilet, arrangement on the outer rim thus not reducing the useful cross-sectional area of the toilet bowl.

A significant advantage of the invention is the separation of the release device into a dispenser and a container couplable with the dispenser, whereby the release device may be used flexibly and adapted simply for the widest possible range of applications.

Release Element

Release elements are any kind of device suitable for releasing a preparation into the surrounding environment of the release device. In particular, a release element takes the form of a piezoelectric element for spraying and/or atomization of a preparation.

It is particularly preferred for the release element to be suitable for applying at least one first preparation from at least one first container, which is connected in communicating manner with the release element, onto a surface, in particular onto a surface in a toilet bowl, wherein the release element is a piezoelectric element.

It is advantageous to configure the release element and the control unit in such a manner that the speed of release of active substance fluid from the release element is adjustable by means of an amplitude modulation of the oscillation which excites the release element, whereby an application field within the toilet bowl defined by the lower and upper speed limits is wetted with active substance fluid. In this way, it is possible to introduce not only a defined, punctiform "application spot" into the toilet bowl but also an extensive application field.

In an advantageous further development of the invention, the release element and the control unit are configured such that the release element generates an acoustic signal in the audible range.

The release elements may exhibit identical or different spray cone shapes when releasing the preparations. It is accordingly for example conceivable for one release element to produce a jet with a somewhat punctiform application area, while another release element produces an extensive application field. It goes without saying that various combinations of the most varied spray cone shapes are conceivable.

The release element may moreover provide means for electrostatic charging of active substance droplets, whereby the wetting, adhesion and/or distribution of the active substance on a surface and/or in the air is improved.

It is moreover advantageous to arrange the release element in movable manner on the clip of the toilet freshener. In this way, the user can purposefully orient the release element and the spray cone of the preparation in order to wet a defined application field in or on the toilet with preparation.

The release element(s) is/are advantageously configured such that, irrespective of the positioning of the toilet freshener on the toilet bowl, a defined amount of at least one active substance preparation is released in directed and defined manner into the interior of a toilet bowl. The advantages of such a development are inter alia the more specific exposure of surfaces of the toilet bowl to one or more active substances, wherein different surfaces may be treated with active substances which differ from one another. For example, in the case of a German style flat-pan toilet, the pan may be wetted with an active substance for reducing adhesions, while an active substance for reducing lime deposits is applied onto the funnel-shaped walls extending from the pan to the rim of the toilet.

Control Unit

The control unit may in particular comprise a programmable microprocessor. In a particularly preferred embodiment of the invention, a plurality of dispensing programs are stored in the microprocessor which may be selected and executed depending on the container coupled to the toilet freshener. It is, of course, likewise conceivable for the dispensing programs to be manually invocable by the user.

The control unit is preferably also arranged on the outwardly directed side of the toilet bowl, from where it may straightforwardly be operated by the user, in particular when the user is sitting on the toilet.

In a particularly preferred development of the invention, the control unit may comprise a dispensing program for introducing at least two different active substance preparations into a toilet bowl or into the surrounding environment of the toilet bowl, in which at least two successive points in time $t_1$ and $t_2$ at least two different active substance preparations are released, wherein at least one active substance preparation is introduced into the interior of a toilet bowl.

A substantial advantage of such a dispensing program is inter alia optimized cleaning performance thanks to maximally exact control of possible chemical reactions due to appropriately time-offset release of the corresponding preparation or preparations, some examples of which are listed, but not exhaustively, in the following table.

| $t_1$ | $t_2$ | Advantage |
|---|---|---|
| Cleaning product in toilet bowl during flushing process | Scent in toilet bowl after flushing | Optimized scent development, since scent is released into the toilet bowl after flushing and is consequently not flushed away with the flush water. Scent is not "decomposed" by cleaning preparation. |
| Scent in toilet bowl immediately before use | Cleaning product in toilet bowl during flushing process | Optimized scent development, since scent is released into the toilet bowl before flushing and is consequently not flushed away with the flush water. Scent is not "decomposed" by cleaning preparation. |
| Cleaning product A in toilet bowl immediately before use | Cleaning product B in toilet bowl during flushing process | Cleaning product A may prevent adhesions in the toilet bowl by a protective film of cleaning product A being applied in the toilet bowl immediately before the toilet is used, which protective film is then flushed back off the toilet surface by cleaning product B during the flushing process. |

Sensor Unit

The sensor unit may comprise one or more active and/or passive sensors for the qualitative and/or quantitative detection of mechanical, electrical, physical and/or chemical variables which are passed to the control unit as control signals.

In particular, the sensors of the sensor unit may be selected from the group of timers, infrared sensors, brightness sensors, temperature sensors, motion sensors, strain sensors, rotational speed sensors, proximity sensors, flow sensors, color sensors, gas sensors, vibration sensors, pressure sensors, conductivity sensors, turbidity sensors, instantaneous acoustic pressure sensors, "lab-on-a-chip" sensors, force sensors, acceleration sensors, inclination sensors, pH sensors, moisture sensors, magnetic field sensors, RFID sensors, magnetic field sensors, Hall sensors, biochips, odor sensors, hydrogen sulfide sensors and/or MEMS sensors.

The sensor unit and the release element are in particular constructed as a single component.

It is particularly preferred for the sensor unit to be a piezoelectric element which is suitable for picking up oscillations from the surrounding environment and/or from the surrounding environment of the toilet and converting them into a sensor signal, which is converted in the control unit into a control signal, in particular for the release element.

The piezoelectric sensor unit may also be configured in conjunction with the corresponding control unit such that for example inflow noises in a washing machine, vibrations from the rotation of a washing drum, running noises and/or vibrations from a pump in a washing machine or dishwasher or a washer/dryer, spraying noises in the interior of a dishwasher or the like are detected and evaluated with regard to the dispensing time and/or dispensing amount of a preparation.

In one advantageous development of the invention, the sensor unit is configured such that triggering of the flush water stream is detected without intervening in the flush water flow and a sensor signal which represents triggering of the flush water stream is generated.

According to one preferred embodiment of the invention, the sensor unit is configured such that it detects structure-borne noise of the toilet bowl which is brought about by triggering of the flush water stream, and a sensor signal which represents triggering of the flush water stream is generated.

Alternatively or additionally, the sensor unit may also be configured such that sound within the toilet bowl which is brought about by triggering of the flush water stream is detected and a sensor signal which represents triggering of the flush water stream is generated.

It is advantageous for the sensor unit and the release element to be directed into the interior of the toilet bowl.

It is moreover preferable for the sensor unit and the control unit to be configured such that a sensor signal is generated and/or evaluated in such a manner that wetting of the release element with active substance fluid is represented and/or detectable. This makes it possible, for example, once the active substance container has been completely emptied, to generate a corresponding signal which indicates to the consumer that emptying has occurred.

In its simplest conceivable embodiment, the sensor unit may also be embodied as a toggle, pressure or momentary-contact switch.

Energy Source

For the purposes of the present application, an energy source is taken to mean a component of the release device which is capable of providing energy which is suitable for autonomous operation of the release device.

The energy source preferably provides electrical energy. The energy source may for example comprise a battery, a mains power supply, solar cells or the like.

It is particularly advantageous to make the energy source interchangeable, for example in the form of a replaceable battery.

It is, however, also in principle conceivable for the power source to be a mechanical power source, such as for example a dynamo which converts mechanical or fluidic energy into electrical power. The latter may then be stored in suitable storage elements, such as for example a capacitor or storage battery.

Container

For the purposes of the present application, a container is taken to mean a packaging means which is suitable for enclosing or holding preparations and which is couplable to the dispenser for releasing the preparation.

A particularly preferred arrangement is that in which two containers are provided which, further preferably, are separate from one another and in each case contain an active substance fluid. There may, however, also be a plurality of storage containers for a plurality of active substance fluids. The storage containers are separate from one another in order to prevent premature mixing of the active substance fluids. They may be physically separate or take the form of separate compartments in a single body.

The container conventionally has a capacity of <5000 ml, in particular <1000 ml, preferably <500 ml, particularly preferably <250 ml, very particularly preferably <50 ml.

The invention is in particular suitable for dimensionally stable containers such as pots, tins, capsules, cartridges, bottles, canisters, cans, cartons, drums or tubes, but may also be used for flexible containers such as pouches or bags, in particular if they are used in accordance with the bag-in-bottle principle.

In particular, a container may also comprise a plurality of chambers which may be filled with different compositions. It is also conceivable for a plurality of containers to be combined into a unit, for example into a cartridge.

The following table shows examples of possible combinations of containers or chambers with the corresponding preparations for some applications.

| Container A | Container B | Container C |
|---|---|---|
| Cleaning agent | Scent | |
| Cleaning agent A | Cleaning agent B | |
| Cleaning agent A | Cleaning agent B | Scent |

In a preferred embodiment of the invention, the container comprises an RFID label which at least contains information about the contents of the container and which is readable by the sensor unit.

This information may be used in order to select a dispensing program stored in the control unit. In this way it may be ensured that the ideal dispensing program is always used for a specific preparation. It may also be provided that, in the absence of an RFID label or in the case of an RFID label with an incorrect or defective ID, the release device does not dispense but instead an optical or acoustic signal is produced which notifies the user of the error.

In order to prevent misuse of the containers, the containers may also comprise structural elements which interact with corresponding elements of the dispenser like a key in a lock, such that for example only containers of a particular type are couplable to the dispenser. This development furthermore makes it possible for information about the container coupled to the dispenser to be transmitted to the control unit, whereby the release device may be controlled in a manner adapted to the contents of the corresponding container.

In a further development of the invention, the container may be under pressure. This is of advantage in particular if the preparation is to be sprayed or released without requiring the interposition of a pump. In this case, release of the preparation may be controlled or regulated for example by a control valve which is in active connection with the control unit. This embodiment has the further advantage that no power need be provided by the power source for transporting the preparation, meaning that the power source may either be made smaller or will have a longer anticipated life.

Fastening Means

The toilet freshener moreover comprises fastening means in order to fix the toilet freshener to the toilet bowl. The fastening means may for example take the form of a suction cup, adhesive tape, clip or the like.

The toilet freshener may alternatively also be fastened to the toilet cistern, the toilet seat or to the toilet lid. Fastening means sufficiently well known from the prior art may be used for this purpose.

Preparations

Preparations for the purpose of these applications are compositions which contain at least one substance from the group of cleaning agents and/or scents.

According to a further, preferred development of the invention, the preparations comprise substances for modifying surfaces, in particular ceramic surfaces.

Preparations which are suitable according to the invention are for example scent phases, in particular perfumed scent phases. Such scent phases conventionally contain at least one scent, preferably a perfume oil, at least one surfactant or an emulsifier and water and optionally further ingredients such as preservatives, thickeners, complexing agents, dyes, further surfactants, or emulsifiers, stabilizers, limescale removers etc.

Preparations which are likewise suitable according to the invention are bleach phases, in particular chlorine-containing bleach phases, preferably bleach phases based on hypochlorite, wherein, in addition to the actual bleaching agent and water, the bleach phases may conventionally optionally contain further ingredients such as thickeners, surfactants or emulsifiers, neutralizing agents, dyes, scents etc.

Further preparations which are suitable according to the invention are limescale removing active substance phases, preferably acidic limescale removing active substance phases. In addition to the actual limescale remover (which preferably comprises an organic or inorganic acid) and water, such limescale removing active substance phases may optionally contain further ingredients such as surfactants or emulsifiers, thickeners, scents, preservatives etc.

It is likewise possible to use highly concentrated surfactant phases, or "foam boosters" as they are known, as preparations. In addition to the surfactants, such highly concentrated surfactant phases may also contain still further, conventional ingredients. Such foam boosters are in particular advantageous for pretreating the toilet bowl with a carpet of foam, in order for example to prevent adhesion of excreted metabolites to the surface of the toilet or to reduce and/or trap malodors.

Preparations with an antibacterial and/or fungicidal and/or antiviral active substance phase are likewise suitable according to the invention, wherein in addition to the antibacterial and/or fungicidal and/or antiviral active substance and water, the active substance phase may optionally contain further ingredients, such as for example surfactants or emulsifiers, thickeners, scents, preservatives etc.

It is furthermore possible for the preparations to be enzyme-containing active substance phases. In addition to enzyme(s) and water, such enzyme-containing active substance phases may optionally contain further ingredients such as surfactants or emulsifiers, thickeners, scents, preservatives, etc.

It is likewise possible for the preparations used according to the invention to be absorbent, in particular odor-absorbing active substance phases. In addition to the absorbent, in particular odor absorbent, and water, said phases may optionally contain further ingredients such as surfactants or emulsifiers, thickeners, scents, preservatives etc.

According to one particular embodiment, the toilet freshener according to the invention provides the possibility of using combinations of different preparations in the storage containers, wherein according to a preferred embodiment one of the storage containers contains a scent phase, in particular as defined above.

Examples of preparation combinations to be used are a perfumed scent phase combined with chlorine bleach (not stable when stored together), perfumed scent phase with highly concentrated surfactant phase (foam booster), scent phase with limescale removing, acidic active substance phase, scent phase with antibacterial active substance phase, various acid systems, scent phase combined with enzyme-containing active substance phase, perfumed acid phase combined with water-coloring phase, scent phase with odor-absorbing phase, perfumed acid phase with active oxygen, perfumed acid phase with active substance phase, polyacrylate-thickened etc.

High-viscosity to gel-like active substance fluids with viscosities of the order of a few thousand mPa·s, in particular from 200 to 5000 mPa·s, preferably 500 to 3500 mPa·s (measured with RotoVisko LVTV II, spindle 31, 5 rpm, 20° C.) are of particular interest here.

In a further, preferred development of the invention the preparations have a viscosity of less than 2000 mPa·s, in particular of less than 1000 mPa·s (measured with RotoVisko LVTV II, spindle 31, 5 rpm, 20° C.). Such low-viscosity to watery preparations are in particular suitable if the preparation is to be sprayed into or onto the toilet bowl.

Using low-viscosity active substance preparations in conjunction with the toilet freshener according to the invention makes it possible to achieve substantially faster and more accurate dispensing and to dispense with the use of thickening systems. Active substance systems may furthermore be used which can only be prepared in low viscosities, for example based on chlorine, HCl, etc.

The invention is explained in greater detail with reference to the figures which merely show exemplary embodiments. In the Figures:

FIG. 1 shows a release device which takes the form of a toilet freshener 1. The toilet freshener 1 consists of the dispenser 2 and a container 3 couplable with the dispenser 2, which container stores a preparation 4. FIG. 1 shows the dispenser 2 and the container 3 in the coupled state.

A U-shaped clip 5 extends from the top of the dispenser 2, wherein, in the operational position shown on the toilet bowl 8, the dispenser 2 is arranged on the vertical leg of the clip 5 extending on the outside of the toilet, while a piezoelectric element 6 is positioned as release element, sensor unit and acoustic transducer at the distal end of the vertical leg of the clip 5 extending on the inside of the toilet, wherein the horizontal leg of the U-shaped clip 5 rests on the toilet bowl 8.

The bottom of the container 3 and the release orifice of the release element 6 are spaced apart from one another in the direction of gravity by a difference in level of $\Delta h$. The release element 6 and the container are connected to one another in communicating manner via the line 9, the line 9 reaching down to the bottom of the container 3. Due to the difference in level $\Delta h$, preparation 4 is conveyed out of the container 3 through the line 9 to the release element 6.

The release element takes the form of a piezoelectric element 6 and is supplied with electrical signals from the control unit 12, such that the preparation 4 is sprayed and/or atomized from the container 3 which is connected in communicating manner with the release element.

The sensor unit is likewise embodied by the piezoelectric element 6, wherein the piezoelectric element 6 is embodied such that it is suitable for picking up oscillations, in particular sound waves and/or for example electromagnetic waves in a frequency range of 1 kHz-300 kHz, preferably of 20-25 kHz and/or structure-borne noise from the surrounding environment of the release device and converting them into a sensor signal which is used in the control unit 12 for controlling release of the preparation.

It may alternatively be advantageous to configure the piezoelectric element 6 in such a manner that it is suitable for picking up oscillations, in particular sound waves and/or for example electromagnetic waves in a frequency range of 1 kHz-300 kHz, preferably of 20-41 kHz, particularly preferably of 27-41 kHz from the surrounding environment of the release device and converting them into a sensor signal which is used in the control unit 12 for controlling release of the preparation.

In both the described variants, the piezoelectric element 6 may moreover be operated as an acoustic transducer by its being supplied with electrical signals from the control unit 12 which are converted by the piezoelectric element 6 into audible acoustic signals in a frequency range of 20 Hz to 20 kHz, preferably of 5-15 kHz, particularly preferably of 7-10 kHz.

As is clear from FIG. 1, the piezoelectric element 6 is arranged on the freely mobile, distal end of the vertical leg of the clip 5 extending on the inside of the toilet. The piezoelectric element consequently experiences the largest possible amplitude of oscillation, whereby the sensitivity of the sensor unit is improved.

The piezoelectric element 6 configured as release element and sensor unit is connected to the control unit 12 via a signal/power line 14, such that control signals are transmitted to or from the piezoelectric element 6. The electrical energy required for this purpose is supplied by a battery 13 or a storage battery arranged in the dispenser 2.

The clip 5 is in particular of dimensionally stable construction, such that the line 9 and/or the signal/power line 14, which preferably extend within the clip 5, are protected from mechanical influences. It is, however, also possible to arrange the line 9 and/or the signal/power line 14 outside the clip 5.

A fastening means 10 taking the form of a spring is furthermore arranged on the vertical leg of the clip 5 extending vertically on the inside of the toilet. The spring 10 is of substantially V-shaped construction, wherein one leg of the V-shaped spring 10 is firmly arranged on the clip 5, while the free leg of the V-shaped spring 10 presses against the inner surface of the toilet bowl 8. This results, on the one hand, in detachable fixing of the toilet freshener 1 to the toilet bowl 8, while, on the other hand, vibrations and/or structure-borne noise are transmitted from the toilet bowl 8 to the toilet freshener and in particular to the piezoelectric element 6.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A release device for releasing a flowable preparation, comprising
   an electrical energy source;
   a control unit connected to the energy source and configured to receive a sensor signal from a sensor unit and, responsive thereto, to convert the sensor signal into a control signal;
   a piezoelectric element configured to act as the sensor unit, a release element, and an acoustic transducer,
      wherein when acting as the sensor unit, the piezoelectric element receives one or more of sound waves in a frequency range of 1 kHz-300 kHz and/or structure-borne noise from the surrounding environment of the release device, and converts the sound waves into the sensor signal; and
      wherein, when acting as a release element, the piezoelectric element that is supplied with the control signal from the control unit sprays at least one first preparation from at least one first container which is connected in communicating manner with the release element; and
      wherein, when acting as an acoustic transducer, the piezoelectric element is supplied with the control signal and converts the control signal into audible acoustic signals in a frequency range of 20 Hz to 20 kHz.

2. The release device according to claim 1, wherein the control unit produces electrical signals having a frequency of 70-400 kHz, and the electrical signals bring about the generation of an audible acoustic signal having a frequency of 20 Hz-20 kHz.

3. The release device according to claim 2 wherein the control unit is configured to supply, simultaneously or with a time delay, electrical signals to the piezoelectric element which bring about spraying of a preparation and electrical signals which bring about the generation of an audible acoustic signal.

4. The release device according to claim 1, wherein the preparation contains at least one surfactant.

5. The release device according to claim 1, wherein the release device is configured for use as a toilet freshener.

6. The release device according to claim 1, wherein the release device is provided for dispensing the preparation into a washing and/or dishwashing machine.

7. A method for operating a release device according to claim 1, the method comprising:
   a. receiving in the sensor unit the sound waves in a frequency range of 1 kHz-300 kHz and/or structure-borne noise from the surrounding environment of the release device and converting them into a sensor signal;
   b. receiving in the control unit the sensor signal and converting it into a control signal;
   c. receiving in the release element the control signal and, responsive thereto, spraying and/or atomizing at least one first preparation from the at least one first container; and
   d. receiving in an acoustic transducer the control signal before and/or during and/or after spraying of the preparation, and converting the control signal into the audible acoustic signals in a frequency range of 20 Hz to 20 kHz.

8. A piezoelectric element for use in the release device according to claim 1, wherein the piezoelectric element is configured
   to pick up sound waves in a frequency range of 1 kHz-300 kHz and/or structure-borne noise,
   to reproduce audible acoustic signals in a frequency range of 20 Hz to 20 kHz, and
   to reproduce electrical signals which have a frequency of 70-400 kHz, and bring about spraying and/or atomization of a preparation.

* * * * *